US005266964A

United States Patent [19]

Takahashi et al.

[11] Patent Number: 5,266,964

[45] Date of Patent: Nov. 30, 1993

[54] PIEZOELECTRIC INK JET PRINTER HEAD

[75] Inventors: Yoshikazu Takahashi, Kasugai; Masahiko Suzuki, Nagoya, both of Japan

[73] Assignee: Brother Kogyo Kabushiki Kaisha, Nagoya, Japan

[21] Appl. No.: 756,982

[22] Filed: Sep. 9, 1991

[30] Foreign Application Priority Data

Sep. 14, 1990 [JP] Japan .................................. 2-245307

[51] Int. Cl.[5] ........................ B41J 2/045; H01L 41/08

[52] U.S. Cl. .................................... 346/1.1; 29/25.35; 29/890.1; 310/357; 310/366; 346/140 R

[58] Field of Search ............................ 346/1.1, 140 R; 310/328, 330, 333, 357, 365, 366, 363, 364, 331, 359; 29/25.35, 890.1

[56] References Cited

U.S. PATENT DOCUMENTS

| | | | |
|---|---|---|---|
| 4,523,121 | 6/1985 | Takahashi et al. | 310/334 |
| 4,584,590 | 4/1986 | Fischbeck et al. | 346/140 R |
| 4,766,671 | 8/1988 | Utsumi et al. | 29/848 |
| 4,825,227 | 4/1989 | Fischbeck et al. | 346/1.1 |
| 5,086,308 | 2/1992 | Takahashi et al. | 346/140 R |

OTHER PUBLICATIONS

"Multilayer Transducers" Xerox Disclosure Journal, vol. 8 No. 5 Sep./Oct. 1983 p. 419.

*Primary Examiner*—Benjamin R. Fuller
*Assistant Examiner*—Alrick Bobb
*Attorney, Agent, or Firm*—Oliff & Berridge

[57] ABSTRACT

In a piezoelectric ink jet printer head having a laminated piezoelectric layer, actuating voltage is applied between only electrodes corresponding to a selected jetting device. A part of the piezoelectric ceramic layers between the electrodes is deformed in accordance with a slip effect, to jet ink from the selected jetting device. Since the polarization direction of the piezoelectric ceramic layers is almost perfectly perpendicular to the direction of an actuating electric field, the actuating voltage can be reduced. Further, piezoelectric ceramic layers can be stacked to obtain the necessary strength of a laminated piezoelectric element without decreasing the displacement amount. Thus, the reliability of the laminated piezoelectric element is enhanced. Moreover, the insulation of the electrodes is not deteriorated by a short circuit, migration of silver or the like. Such properties as durability and moisture resistance are also enhanced. Therefore, the printer head of the invention requires no components for preventing the deterioration of the insulation needed for prior art printer heads. The printer head can be thus made compact and lightweight, reducing the manufacturing cost.

14 Claims, 6 Drawing Sheets

RELATED ART

PIEZOELECTRIC INK JET PRINTER HEAD

BACKGROUND OF THE INVENTION

This invention relates to a piezoelectric ink jet printer head, and more particularly to a printer head employing a laminated piezoelectric element as a piezoelectric transducer.

In a recent printer, a piezoelectric ink jet has been utilized for a printer head. Such a ink jet employs a known method of 'drop-on-demand' mechanism, in which an ink chamber separated by a pair of valves changes the volume of the chamber in accordance with a dimensional displacement of a piezoelectric actuator. More specifically, ink in the ink chamber is jetted from one of the valves when the volume of the chamber is reduced. On the other hand, when the volume is increased, ink is supplied from the other valve to the ink chamber. Multiple jetting devices utilizing the ink jet mechanism are mounted close to each other in the printer head. Desired characters and images can be formed by jetting ink from a selected jetting device.

In the prior art piezoelectric ink jet printer head, one piezoelectric actuator is employed for each jetting device. Thus, the structure of the printer head becomes complicated if a number of the jetting devices are densely arranged to attain a wide-ranging printing with high resolution. In this case, many steps are required to construct the printer head, resulting in high cost. Moreover, since there is a constructional limitation for miniaturizing the actuator, it is difficult to make each jetting device smaller in size. Therefore, only limited resolution can be attained with such a printer head.

To solve the above-mentioned problems, a new type piezoelectric ink jet printer head has been recently proposed. In this ink jet printer head, one piezoelectric actuator is mounted on a plurality of ink chambers. Upon operation, only a part of the piezoelectric actuator which corresponds to a selected jetting device is deformed. Such a printer head is disclosed, for example, in U.S. Pat. No. 4,584,590. FIG. 8 shows a section of a piezoelectric actuator 88 during actuating which is employed in the reference. The piezoelectric actuator 88 is provided with negative electrodes 92*a*, 92*b*, and 92*c*, and positive electrodes 94*a* and 94*b* on the surface of a single piezoelectric ceramic plate 90. The ceramic plate 90 is polarized in the direction indicated in FIG. 8. When actuating voltage is applied between the positive electrode 94*a* and the negative electrode 92*a* and 92*b*, an actuating electric field is generated in the piezoelectric ceramic plate 90 in the direction substantially orthogonal to the polarization direction. The positive electrode 94*a* then moves downward as shown in FIG. 8 in accordance with displacement by the slip effect. Drops of ink are thus jetted from the jetting device (not shown) corresponding to the positive electrode 94*a*. A piezoelectric ink jet printer head employing the piezoelectric actuator 88 as a piezoelectric transducer can be easily manufactured at a low cost. Additionally, such a printer head can attain high resolution.

However, in the piezoelectric actuator 88, the actuating electrodes are mounted only on the surface of the piezoelectric ceramic plate 90. Thus, the direction of the actuating electric field is not perfectly perpendicular to the polarization direction. Apparent piezoelectric constant $d_{15}$ becomes small. Therefore, high voltage of about 200 V is required to obtain the necessary displacement. In order to make the direction of the actuating electric field more orthogonal to the polarization direction, a thinner piezoelectric ceramic plate may be employed. However, if the ceramic plate is thin, the strength of the plate is reduced. Moreover, a short circuit by an electric discharge may occur, since the opposite electrodes are arranged at such a small interval, typically about 0.5 mm. If various methods are taken to prevent the short circuit, the printer head becomes heavy and large in size, and the manufacturing cost is increased.

SUMMARY OF THE INVENTION

An object of the present invention is to solve the aforementioned problems, providing a piezoelectric ink jet printer head which operates with low voltage. The printer head of the invention has a simple structure, can be manufactured at low cost, is small in size and is highly reliable.

To attain the object, the piezoelectric ink jet printer head comprising multiple jetting devices which jet ink from ink chambers by varying the volume of the ink chambers by means of a piezoelectric transducer, wherein piezoelectric ceramic layers and interior, separated electrode layers are stacked alternately for forming a laminated piezoelectric element, said piezoelectric ceramic layers are provided with said interior, separated electrode layers above the center and both sides of said ink chambers, said laminated piezoelectric element is mounted on a plurality of said ink chambers and acts as said piezoelectric transducer, an actuating electric field is applied to said piezoelectric ceramic layers in the direction substantially perpendicular to a polarization direction to attain a displacement by a slip effect.

According to the piezoelectric ink jet printer head thus manufactured, actuating voltage is applied between only the electrodes corresponding to the selected jetting device. The part of the piezoelectric ceramic layers between the electrodes is deformed in accordance with a slip effect. Then ink is jetted from the selected jetting device.

DETAILED DESCRIPTION OF THE EMBODIMENTS

Preferred embodiments of the present invention is now described with reference to the drawings.

Embodiment 1

Figure 6:
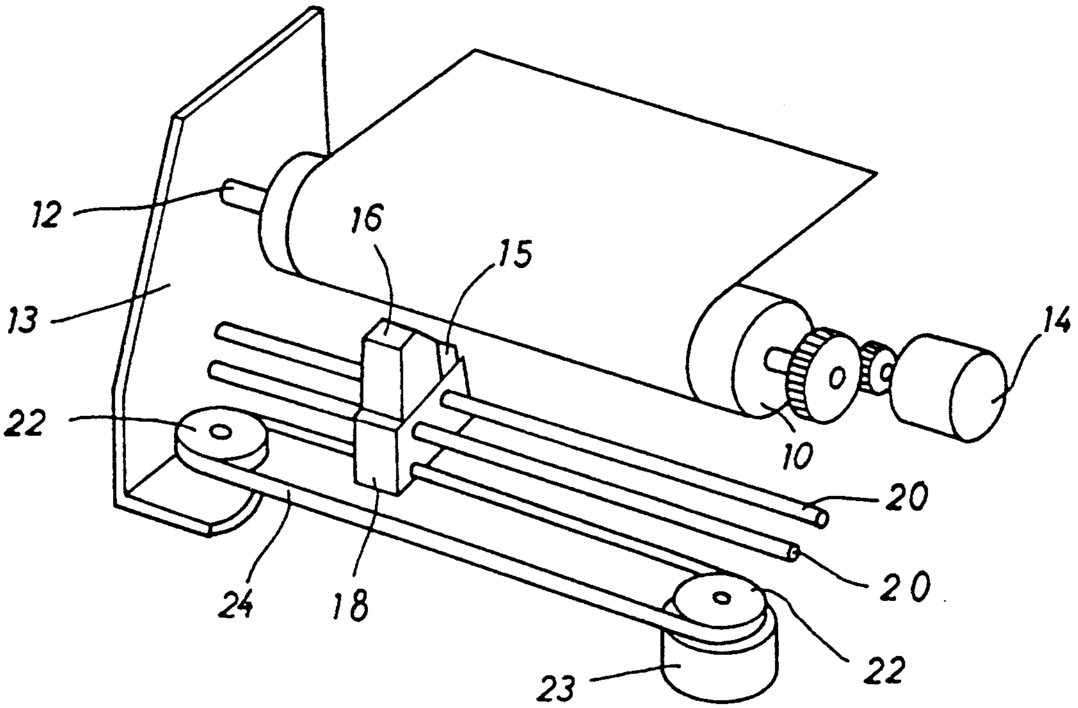
FIG. 6 is a schematic perspective view showing an ink jet printer with an ink jet printer head for the present invention.

As shown in FIG. 6, a platen 10 is rotatably connected to a frame 13 by means of an axle 12. A motor 14 actuates the platen 10. A piezoelectric ink jet printer head 15 is fixed facing the platen 10. The printer head 15 and an ink supply 16 are mounted on a carriage 18. The carriage 18 is slidably supported on a pair of guide rods 20 parallel to the axial direction of the platen 10. The carriage 18 is driven by a timing belt 24, which is wound on a pair of pulleys 22. When the pulley motor 23 rotates one of the pulleys 22, the carriage 18 moves along the platen 10 in accordance with the movement of the timing belt 24.

Figure 1:
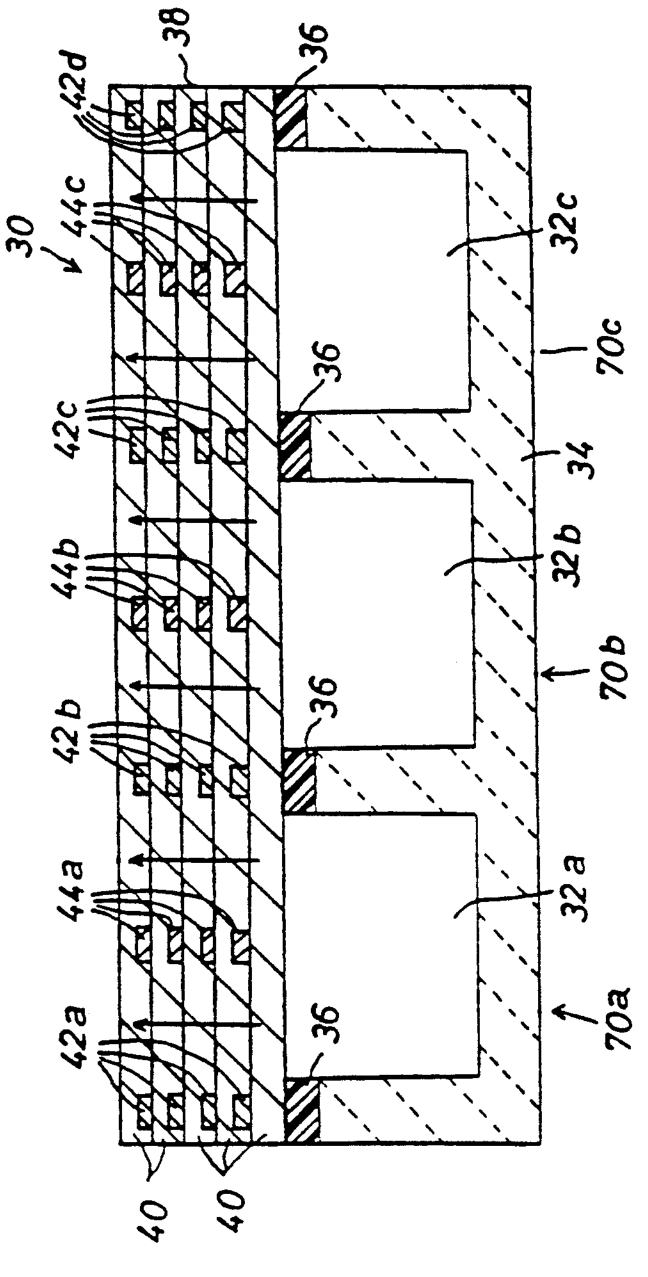
FIG. 1 is a section view of an array which composes a piezoelectric ink jet printer head for a first embodiment of the present invention.

Turning to FIG. 1, an array 30 employed in the printer head 15 is illustrated. The array 30 comprises a rectangular channel 34 which has cavities inside and contains ink channels 32a through 32c. In a typical design, the ink channels 32a through 32c have a width of 0.5 mm in the lateral direction of FIG. 1, and a length of 10 mm in the direction orthogonal to the surface of FIG. 1. The ink channels 32a through 32c have no ceiling. The array 30 also includes a laminated piezoelectric element 38, which is fixed to the top of channel 34 by means of fixing members 36. The fixing members 36 consist of metal having a low melting point, glass having a low melting point, or epoxyresin adhesive. The ink channels 32a through 32c form an ink chamber.

The laminated piezoelectric element 38 comprises a plurality of piezoelectric ceramic layers 40 having a piezoelectric effect and an electrostrictive strain effect. Four interior negative electrode layers 42a through 42d are stacked on the piezoelectric ceramic layers 40 above each fixing member 36. Three interior positive electrode layers 44a through 44c are stacked on the piezoelectric ceramic layers 40 above the center of each ink channel 32a through 32c. The laminated piezoelectric element 38 has a thickness of 0.25 mm. Each of the piezoelectric ceramic layers 40 consists of a ferroelectric ceramics of titanate zirconatelead (PZT) having a thickness of 40 μm. The piezoelectric ceramic layers 40 are polarized in the laminating direction. The polarization direction is indicated by arrows in FIG. 1. The interior negative electrode layers 42a through 42d, and the interior positive electrode layers 44a through 44c are made of Ag-Pd metal having a thickness of about 2 μm.

Figure 3:
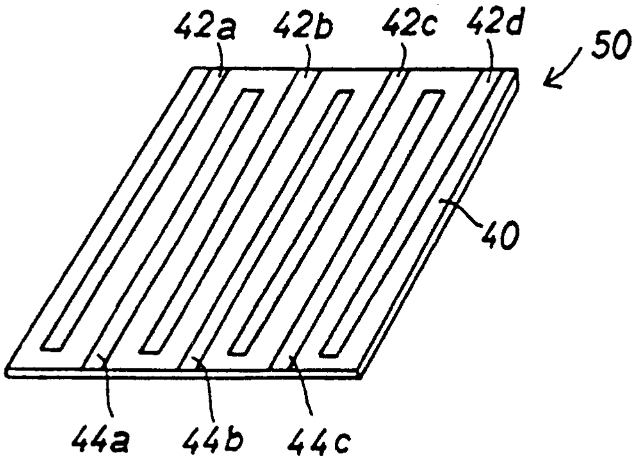
FIG. 3 is a perspective view of a green sheet for the present invention.
Figure 4:
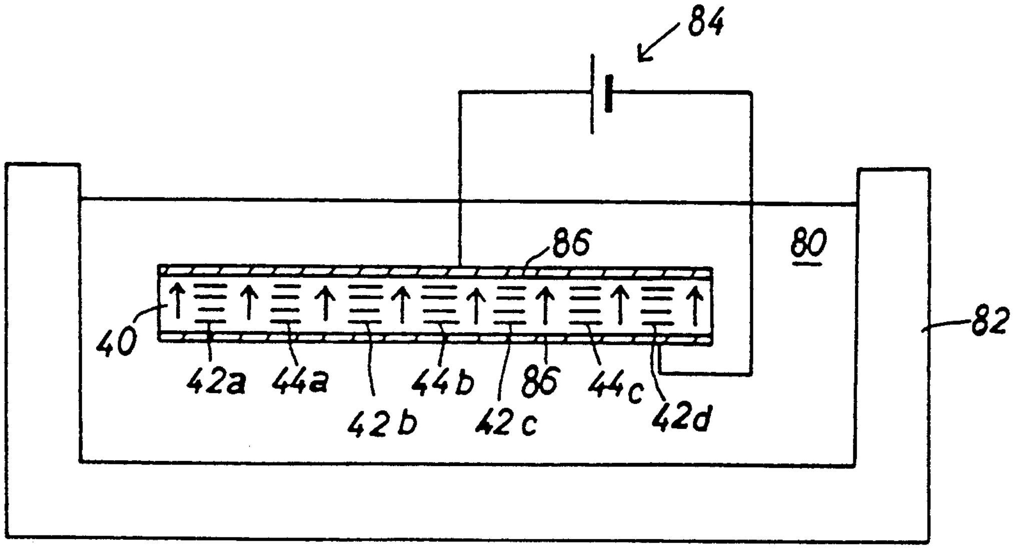
FIG. 4 shows a method for polarizing a laminated piezoelectric element for the first embodiment of the invention.
Figure 5:
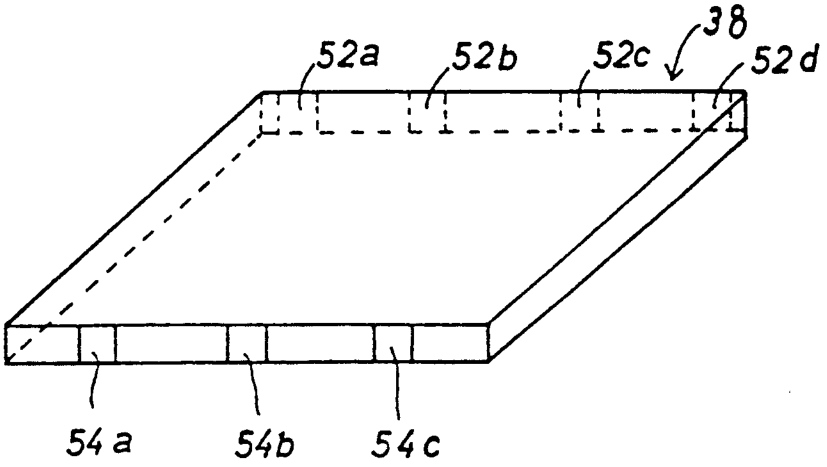
FIG. 5 is a perspective view of the laminated piezoelectric element for the first embodiment of the invention.

The laminated piezoelectric element 38 is manufactured by the following steps. In FIG. 3, the four interior negative electrode layers 42a through 42d are formed on the upper surface of the piezoelectric ceramic layer 40. The three interior positive electrode layers 44a through 44c are also formed on the upper surface of the piezoelectric ceramic layer 40. This interior negative electrode layers 42a through 42d are located above each of the fixing members 36. The interior positive electrode layers 44a through 44c are positioned above the center of each of the ink channels 32a through 32c. Both of the negative electrode layers 42a through 42d and the positive electrode layers 44a through 44c are formed on the material by screen printing. A green sheet 50 is thus obtained. A necessary number of the green sheets 50 are stacked. A green sheet (not shown) without the interior electrode layers on the upper side of the material is laid upon the top of the stacked green sheets 50. The stack of green sheets 50 are pressed with heat, degreased, sintered, and given other necessary treatments to obtain the laminated piezoelectric element 38. As shown in FIG. 4, outside polarizing electrodes 86 are formed on the upper and the lower surface of the laminated stack by sputtering or other methods. The original form with the outside polarizing electrodes 86 is immersed in an oil bath 82 filled with insulating oil 80, such as silicon oil, maintained at a temperature of about 130° C. An electric field of about 2.5 kV/mm is applied between the outside polarizing electrodes 86 by a polarization power source 84 for polarizing the laminated stack. The outside polarizing electrodes 86 are then removed from the original form by etching or other methods. As shown in FIG. 5, outside negative electrodes 52a through 52d are formed on each exposed portion of the interior negative electrode layers 42a through 42d, and outside positive electrodes 54a through 54c are on each exposing portion of the interior positive electrode layers 44a through 44c. The laminated piezoelectric element 38 for the first embodiment is thus obtained.

The ink jet printer head 15 comprises a plurality of the arrays 30 including the piezoelectric element 38 thus manufactured. The arrays 30 are integrally arranged close to each other in the ink jet printer head 15.

Figure 2:
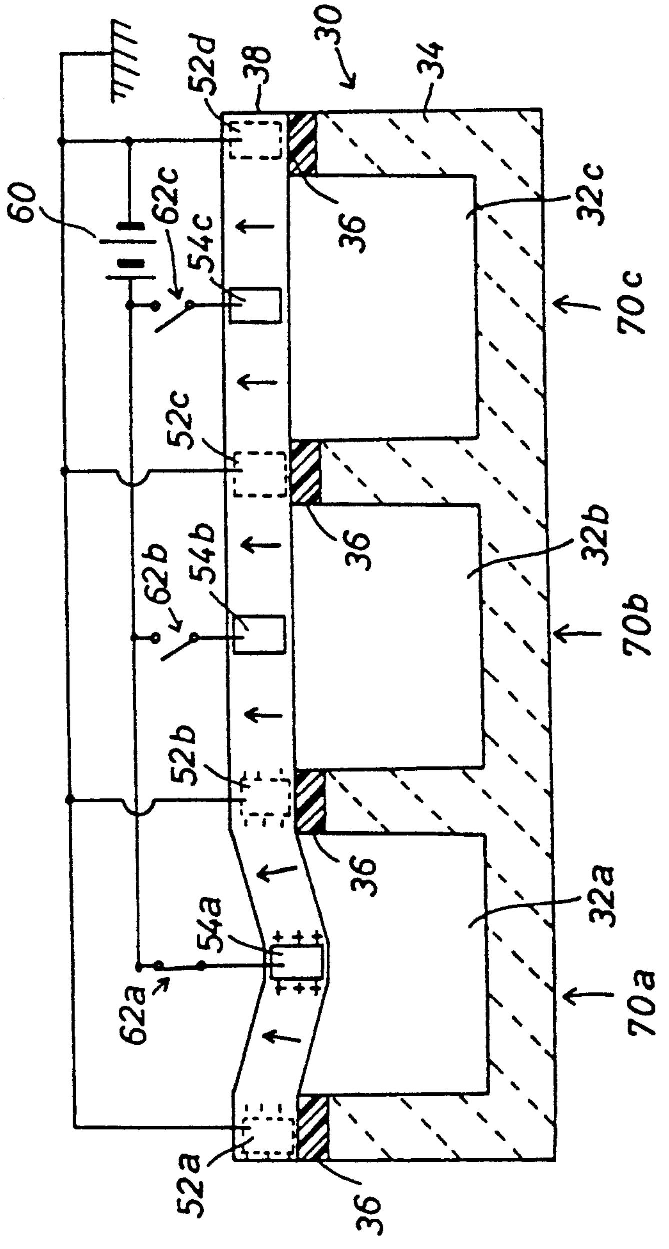
FIG. 2 shows an array provided with an electric circuit for the first embodiment of the invention.

Each of the arrays 30 is provided with an electric circuit as shown in FIG. 2. In the electric circuit, a negative electrode of an actuating power source 60 and the outside negative electrodes 52a through 52d are grounded. A positive electrode of the actuating power source 60 is connected with the outside positive electrodes 54a through 54c via switches 62a through 62c. When the ink channel 32a is selected, the actuating power source 60 applies actuating voltage between the interior negative electrode layers 42a and 42b and the interior positive electrode 44a corresponding to the selected ink channel 32a with the switch 62a, controlled by a controller (not shown).

The operation of the piezoelectric ink jet printer head 15 thus constructed is now described with reference to FIG. 2. When the controller connects the switch 62a, according to predetermined printing data, voltage is applied between the interior negative electrode layers 42a and 42b and the interior positive electrode 44a. A bias electric field in the direction substantially perpendicular to the polarization direction is generated in the piezoelectric ceramic layers 40 between the interior negative electrode layers 42a and 42b and the interior positive electrode 44a. A part of the piezoelectric ceramic layers 40 corresponding to the interior positive electrode 44a is depressed into the ink channel 32a in accordance with a dimensional strain caused by a slip effect of piezoelectric and electrostrictive strain. The volume of the ink channel 32a is thus reduced. Then the ink in the ink channel 32a is jetted from a nozzle by way of a valve (not shown). As the switch 62a is disconnected to break voltage, the part of the piezoelectric ceramic layers 40 corresponding to the interior positive electrode 44a returns to the original position. Then ink is supplied from the ink supply 16 via another value (not shown) to the ink channel 32a with the increase in the volume of the ink channel 32a. If, for example, the switch 62b is actuated, a part of each of the piezoelectric ceramic layers 40 corresponding to the interior positive electrode 44b is deformed to jet ink from the ink channel 32b.

The array 30 of the first embodiment comprises jetting devices 70a through 70c of the piezoelectric ink jet printer head 15. The signal laminated piezoelectric element 38 thus operates as a piezoelectric actuator for the jetting devices 70a through 70c. Therefore, a number of the arrays 30 can be provided in the piezoelectric ink jet printer head 15 without complicating the structure. Moreover, the ink jet printer head 15 can be manufactured by fewer steps at a low cost.

The interior negative electrode layers 42a through 42d are stacked in the laminated piezoelectric element 38 at a small interval of 40 μm. The interior positive electrode layers 44a through 44c are also stacked in the laminated piezoelectric element 38 at the interval of 40 μm. Thus, when actuating voltage is applied between the interior negative electrode layers 42a through 42d and the interior positive electrode layers 44a through 44c, and actuating electric field is generated in the direction almost preferably perpendicular to the polarization direction. The apparent piezoelectric constant $d_{15}$ is thus greater than that of the prior art. Therefore, the necessary actuating voltage, which is usually about 200 V, can be reduced to about 160 V in the first embodiment. Further, even when more piezoelectric ceramic layers 40 are stacked, the laminated piezoelectric element 38 can attain displacement similar to that as described in this embodiment. The necessary strength and the enhanced reliability of the laminated piezoelectric element 38 can be thus obtained by stacking more piezoelectric ceramic layers 40. Moreover, since in the laminated piezoelectric element 38 the interior negative electrode layers 42a through 42d and the interior positive electrode layers 44a through 44c are formed by screen printing, the spaces therebetween can be greatly reduced. Thus, printing resolution can be enhanced by, for example, miniaturizing the array 30 provided with the jetting devices 70a through 70c. The printer head 15 can attain a wide-range printing with high resolution according to the present invention.

Further, since the interior negative electrode layers 42a through 42d and the interior positive electrode layers 44a through 44c in the laminated piezoelectric element 38 are not exposed externally, the insulation of the electrodes is not deteriorated by migration of silver and the like. Such properties as durability and moisture resistance are also enhanced. Therefore, the printer head 15 requires no components for preventing the deterioration of the insulation needed for the prior art printer head. The printer head 15 can be made compact and light-weight, reducing the manufacturing cost.

Embodiment 2

Figure 7:
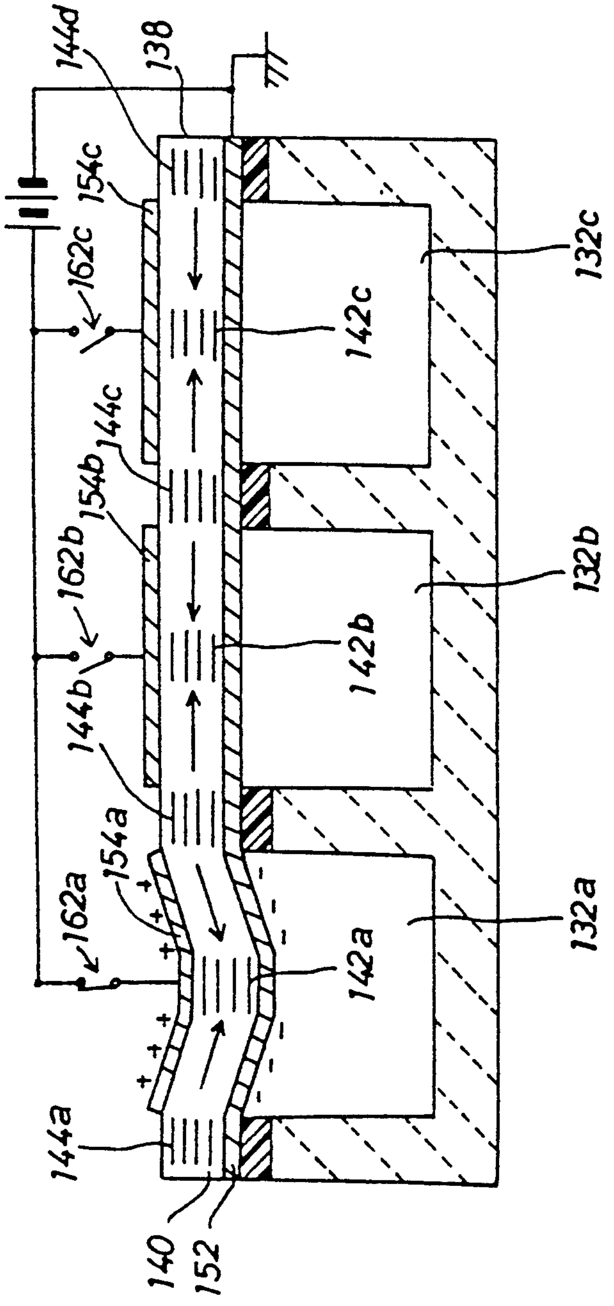
FIG. 7 is a section view of an array for a second embodiment of the invention.
Figure 8:
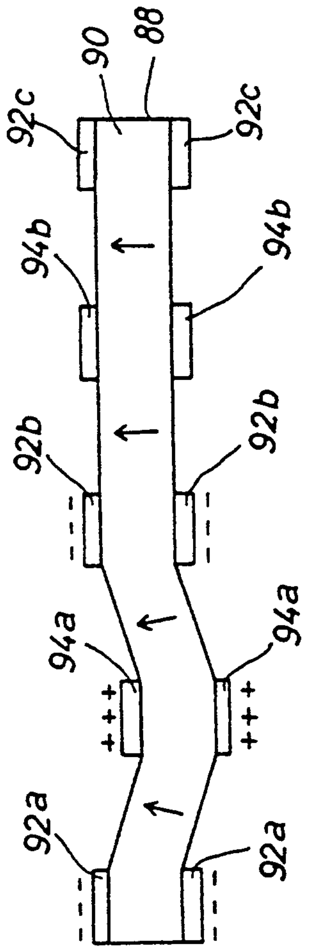
FIG. 8 is a section view of a piezoelectric actuator of the prior art.

The second embodiment is described with reference to FIG. 7, wherein similar numerals denotes components similar to those in the first embodiment.

In the second embodiment, the polarization direction of a laminated piezoelectric element 138 is parallel to the planes of a piezoelectric ceramic layers 140. Actuating bias electric field is generated in the direction perpendicular to the laminating direction. To polarize the laminated piezoelectric element 138, an electric field of about 2.5 kV/mm is applied between interior negative electrode layers 142a through 142c and interior positive electrode layers 142a through 142c are stacked at the interval of 40 μm. The interior positive electrode layers 144a through 144d are also stacked at the interval of 40 μm. Since the interior negative electrode layers 142a through 142c and the interior positive electrode layers 144a through 144d are stacked at such a small interval, the polarization direction of the piezoelectric ceramic layers 140 is almost perfectly perpendicular to the laminating direction. Outside positive electrodes 154a through 154c are formed on the upper side of the laminated piezoelectric element 138 above ink channels 132a through 132c, respectively. Outside negative electrode 152 is formed on the lower side of the laminated piezoelectric element 138. If, for example, the controller employed in the first embodiment connects a switch 162a according to predetermined printing data, voltage is applied between the outside negative electrode 152 and the outside positive electrode 154a. A bias electric field is generated in the piezoelectric ceramic layers 140 between the outside negative electrode 152 and the outside positive electrode 154a. The direction of the bias electric field is perpendicular to the polarization direction. A part of the piezoelectric ceramic layers 140 beneath the outside positive electrode 154a is depressed into an ink channel 132a according to a dimensional strain caused by the slip effect of piezoelectric and electrostrictive strain. The volume of the ink channel 132a is thus reduced. The ink in the channel 132a is jetted from a nozzle via a valve (not shown). When the switch 162a is disconnected to break voltage, the part of the piezoelectric ceramic layers 140 beneath the outside positive electrode 154a returns to the original position. Ink is then supplied from the ink supplier 16 employed in the first embodiment via another valve (not shown) into the ink channel 132a with the increase in the volume of the ink channel 132a. Similarly, if a switch 162b is actuated, a part of the piezoelectric ceramic layers 140 beneath the outside positive electrode 154b is deformed to jet ink from an ink channel 132b. As in the first embodiment, voltage can be reduced from about 200 V needed for the prior art printer head to about 160 V in the second embodiment. Further, since the outside positive electrodes 154a through 154c are separated from the outside negative electrode 152 by the laminated piezoelectric element 138, the deterioration of the insulation by short circuit does not occur.

The present invention may be subject to many modifications and changes without departing from the spirit or essential characteristics thereof.

What is claimed is:

1. An ink jet printer head comprising:

a body;

a chamber formed in the body having a predetermined volume for receiving ink;

a piezoelectric body forming at least a portion of a wall of the chamber, the piezoelectric body comprising a first layer of piezoelectric material and a second layer of piezoelectric material superimposed on the first layer;

a first plurality of spaced electrodes disposed on one side of the first layer of piezoelectric material for applying a field extending between the electrodes to the first layer of piezoelectric material;

a second plurality of spaced electrodes disposed on one side of the second layer of piezoelectric material for applying a field extending between the electrodes to the second layer of piezoelectric material; and one of the first and second plurality of spaced electrodes being disposed between the first layer of piezoelectric material and the second layer of piezoelectric material, wherein the first layer of piezoelectric material and the second layer of piezoelectric matertial are polarized in a direction transverse to the first and second layers and the first and second plurality of electrodes are arranged to displace the piezoelectric body and thereby vary the volume of the chamber.

2. An ink jet printer head as in claim 1, wherein displacement electrodes are mounted on opposed surfaces of the piezoelectric body for applying a field to the piezoelectric body to displace the body and thereby vary the volume of the chamber.

3. An ink jet printer head as in claim 2, wherein the first layer of piezoelectric material and the second layer of piezoelectric material are polarized in directions parallel to the first and second layers.

4. An ink jet printer head comprising:

a body;

a plurality of ink jet the chambers in the body, each having a predetermined volume;

a piezoelectric body forming at least a portion of a wall of each of the ink jet chamber, for selectively varying the volume of each of chambers, the piezoelectric body comprising a plurality of superimposed layers of piezoelectric material, wherein the layers of piezoelectric material are disposed in substantially parallel planes and the layers of piezoelectric material are polarized in directions parallel to the planes;

a first interior electrode or applying a first polarity to the piezoelectric body and a second interior electrode for applying a second polarity reverse to that of the first polarity to the piezoelectric body, wherein pairs of the first and second interior electrodes are arranged between a plurality of successive layers of the piezoelectric body; and first and second exterior electrodes sandwiching at least one of said first and second interior electrodes, said first and second exterior electrodes establishing fields for causing portions of layers of piezoelectric material to move to effect the selective variation in volume of the chambers.

5. An ink jet printer head as in claim 4, wherein pairs of the first and second electrodes are arranged between a plurality of successive layers of the piezoelectric body.

6. An ink jet printer head as in claim 5, wherein the pairs of first and second electrodes include a first group disposed adjacent an edge of the chamber and a second group spaced laterally from the first group.

7. An ink jet printer head as in claim 6, wherein the layers of piezoelectric material are disposed in substantially parallel planes and are polarized in a direction transverse to the planes.

8. An ink jet printer head as in claim 4, wherein the piezoelectric body comprises two opposed surfaces and displacement electrodes are disposed on the opposed surface for displacing the piezoelectric body.

9. A method for making an ink jet printer head comprising the steps of:

forming at least two electrodes on one side of a first layer of piezoelectric material, said at least two electrodes being arranged to apply a field to said first layer;

forming at least two electrodes on one side of a second layer of piezoelectric material, said at least two electrodes on the second layer being arranged to apply a field to said second layer;

superimposing the first layer of piezoelectric material on the second layer of piezoelectric material with the electrodes on one of the layers being disposed between the layers, and uniting the first and second layers to form a laminated transducer body;

applying a polarization potential to the electrodes disposed on each layer to polarize the layer in directions substantially parallel to the layer; and uniting the transducer body to a body forming at least one ink jet chamber.

10. A method as in claim 9, wherein the applying a polarization step comprises applying polarization electrodes on opposite surfaces of the laminated body.

11. An ink jet printer head comprising:

a body having a plurality of ink jet chambers;, each having a predetermined volume an actuable transducer element;

means for mounting the transducer element on the body with spaced portions thereof in communication with the ink jet chambers;

the transducer element comprising:

a plurality of layers of piezoelectric material in superimposed relationship, each of the layers being polarized in a direction transverse to the layers; and a pair of electrodes disposed on one side of each of the plurality of layers of piezoelectric material, said pair comprising a first electrode for applying a first polarity to a layer on which the first electrode is disposed and a second electrode for applying a polarity reverse to that of the first electrode to a layer on which the second electrode is disposed, whereby the first and second electrodes disposed on each layer are between adjacent superimposed layers and are in stacked relationship to the electrodes disposed on the plurality of layers, the electrodes being arranged to effect movement of the transducer element to selectivity change the volume of each of the ink jet chambers.

12. An ink jet printer head comprising:

a body having a plurality of ink jet chambers;

an actuable transducer element;

means for mounting the transducer element on the body with spaced portions thereof in communication with the ink jet chambers;

the transducer element comprising:

a plurality of planar layers of piezoelectric material in stacked relationship, each of the layers being polarized in directions parallel to the plane of the layers;

a first plurality of polarizing electrodes disposed between each of the layers of piezoelectric material for effecting polarization of the layers; and a second plurality of electrodes for effecting displacement of portions of the transducer element, the second plurality of electrodes being disposed on opposed surfaces of the transducer element.

13. An ink jet printer head comprising:

a body;

a chamber formedin the body having a predetermined volume for receiving ink;

a piezoelectric body forming at least a portion of a wall of the chamber, the piezoelectric body comprising a first layer of piezoelectric material and a second layer of piezoelectric material superimposed on the first layer, wherein the first layer of piezoelectric material and the second layer of piezoelectric material are polarized in directions parallel to the first and second layers;

a first plurality of spaced electrodes disposed on one side of the first layer of the piezoelectric material for applying a field extending between the electrodes to the first layer of piezoelectric material;

a second plurality of spaced electrodes disposed on one side of the second layer of piezoelectric material for applying a field extending between the electrodes to the second layer of piezoelectric material; and one of the first and second plurality of spaced electrodes being disposed between the first layer of piezoelectric material and the second layer of piezoelectric material, wherein displacement electrodes are mounted on opposed surfaces of the piezoelectric body for applying a field to the piezoelectric body to displace the body and thereby vary the volumn of the chamber.

14. An ink jet printer head comprising:

a body;

a plurality of ink jet chambers in the body;, each having a predetermined volume a piezoelectric body forming at least a portion of a wall of each of the ink jet chambers, for selectively varying the volume of each of the chambers, the piezoelectric body comprising a plurality of superimposed layers of piezoelectric material, wherein the layers of piezoelectric material are disposed in substantially parallel planes and are polarized in a direction transverse to the planes; and a first electrode for applying a first polarity to the piezoelectric body and a second electrode for applying a second polarity reverse to that of the first polarity to the piezoelectric body, wherein pairs of the first and second electrodes are arranged between a plurality of successive layers of the piezoelectric body, the pairs of first and second electrodes including a first group disposed adjacent an edge of the chamber and a second group spaced laterally from the first group, said first and second electrodes comprising means for establishing fields for causing portions of the layers of piezoelectric material to move to effect the selected variation in volume of the chambers, the first and second electrodes both being disposed between an adjacent pair of said superimposed layers of piezoelectric material.

* * * * *